United States Patent [19]

Higuchi et al.

[11] Patent Number: 5,530,826
[45] Date of Patent: Jun. 25, 1996

[54] READ ONLY MEMORY WITH A DATA COMPRESSION SYSTEM

[75] Inventors: Ryohei Higuchi; Masayuki Hirokawa; Kenji Kouda; Masahide Kaneko, all of Itami, Japan

[73] Assignee: Mitsubishi Denki Kabushiki Kaisha, Tokyo, Japan

[21] Appl. No.: 160,752

[22] Filed: Dec. 3, 1993

[30] Foreign Application Priority Data

Jan. 22, 1993 [JP] Japan .................................. 5-009105

[51] Int. Cl.⁶ ................................................. G06F 13/00
[52] U.S. Cl. ................................................. 395/427
[58] Field of Search .............................................. 395/400

[56] References Cited

U.S. PATENT DOCUMENTS

| 4,446,516 | 5/1984 | Nishimura | 364/200 |
|---|---|---|---|
| 4,449,233 | 5/1984 | Brantingham | 381/53 |
| 4,491,934 | 1/1985 | Heinz | 364/900 |
| 4,583,196 | 4/1986 | Koo | 364/900 |
| 4,864,494 | 9/1989 | Kobus, Jr. | 364/200 |
| 4,992,954 | 2/1991 | Takeda et al. | 364/518 |
| 5,097,426 | 3/1992 | Kawamura et al. | 395/110 |
| 5,179,711 | 1/1993 | Vreeland | 395/775 |

Primary Examiner—Kevin J. Teska
Assistant Examiner—Stephen J. Walder, Jr.
Attorney, Agent, or Firm—Lowe, Price, LeBlanc & Becker

[57] ABSTRACT

In a read only memory, compression data of original data are stored in a storage unit, a read address which is given from the outside in order to read original data is converted into a storage address of the compression data in the storage unit which corresponds to the original data, the compression data which is read out in accordance with the converted storage address is expanded to restore the original data, and the restored original data is read out to the outside. In order to make it difficult for an unauthorized person to use the ROM, dummy address conversion data are mixed with address conversion data.

13 Claims, 15 Drawing Sheets

READ ONLY MEMORY WITH A DATA COMPRESSION SYSTEM

BACKGROUND OF THE INVENTION

1. Field of the Invention

The present invention relates to a read only memory (hereinafter, abbreviated as "ROM") such as a mask ROM, or an EPROM.

2. Description of the Related Art

FIG. 1 is a block diagram showing the configuration of a prior art ROM. In the figure, 80 designates the ROM, 83 designates a data storage unit which stores data, 84 designates an address signal line for a read address which is externally given in order to read out data from the data storage unit 83, and 86 designates a data bus through which data read out from the data storage unit 83 are outputted to the outside of the ROM 80.

The procedure of reading out data from the thus configured prior art ROM 80 will be described. At first, a read address is supplied from the outside through the address signal line 84 to the data storage unit 83. Then, the data storage, unit 83 selects data stored at the storage area which is indicated by the read address, and outputs the selected data to the outside of the ROM 80 through the data bus 86, thereby completing the reading of data.

For example, the case where data having the configuration shown in FIG. 2 are stored in the data storage unit 83 will be considered. When address '0' is sent through the address signal line 84, address '0' is given as it is to the data storage unit 83. The data storage unit 83 selects data 'A' stored at the storage area corresponding to address '0' and outputs it to the outside of the ROM 80.

As described above, in a prior art ROM, data are stored as they are or without being subjected to a process such as a compression. This produces a problem in that the storage requirement is increased in proportion to an increase of the amount of data.

Further, since, in a prior art ROM, data are stored as they are or without being subjected to a process such as a compression, it is easy to unduly copy data stored in the ROM.

SUMMARY OF THE INVENTION

It is an object of the invention to provide a ROM in which data are compressed and then stored and therefore the storage requirement can be reduced.

It is another object of the invention to provide a ROM in which it is difficult to copy data or which, even if a data copy is done, increases the storage requirement of a memory for storing the copied data.

The ROM of the invention compresses original data, stores the compression data, converts the read address of the original data into a storage address, reads out the compression data corresponding to the original data, and restores the compression data to the original data. Since compression data which are obtained by compressing original data are stored, the storage requirement of the ROM of the invention can be made small.

In the other ROM of the invention, original data which has been restored once from a compression data is stored in a buffer so that the compression data from which the original data has once been restored is prevented from being further subjected to restoration in a repeated manner. More specifically, it is judged whether or not the original data to be read out is stored in the buffer. When the original data to be read out is not stored in the buffer, the compression data is restored. When the original data to be read is stored in the buffer, the original data in the buffer is outputted without conducting the process of restoring the compression data. This can shorten the read time.

In the further ROM of the invention, dummy address conversion data by which compression data can be read out are previously mixed with address conversion data for converting a read address of original data into a storage address of the compression data. For the user who knows correct address conversion data by which original data can be read out, among the address conversion data in which dummy data are mixed, it is possible to read only the correct compression data corresponding to the original data and to restore only the correct original data. However, a person who does not know the correct address conversion data by which original data can be read out must treat the whole of the address conversion data including the dummy data, as the object of the reading process. Therefore, data are restored from both the compression data corresponding to the original data and the compression data corresponding to the dummy data, resulting in that the amount of read out data is increased as compared with the amount of the original data and that it is difficult to detect the location of the read out data where the correct original data exist. For a person who does not know the mixture of dummy data, therefore, it is extremely difficult to correctly copy stored data.

The above and further objects and features of the invention will more fully be apparent from the following detailed description with accompanying drawings.

DESCRIPTION OF THE PREFERRED EMBODIMENTS

Hereinafter, the invention will be described in detail with reference to the drawings illustrating embodiments.

[First embodiment]

Figure 1:
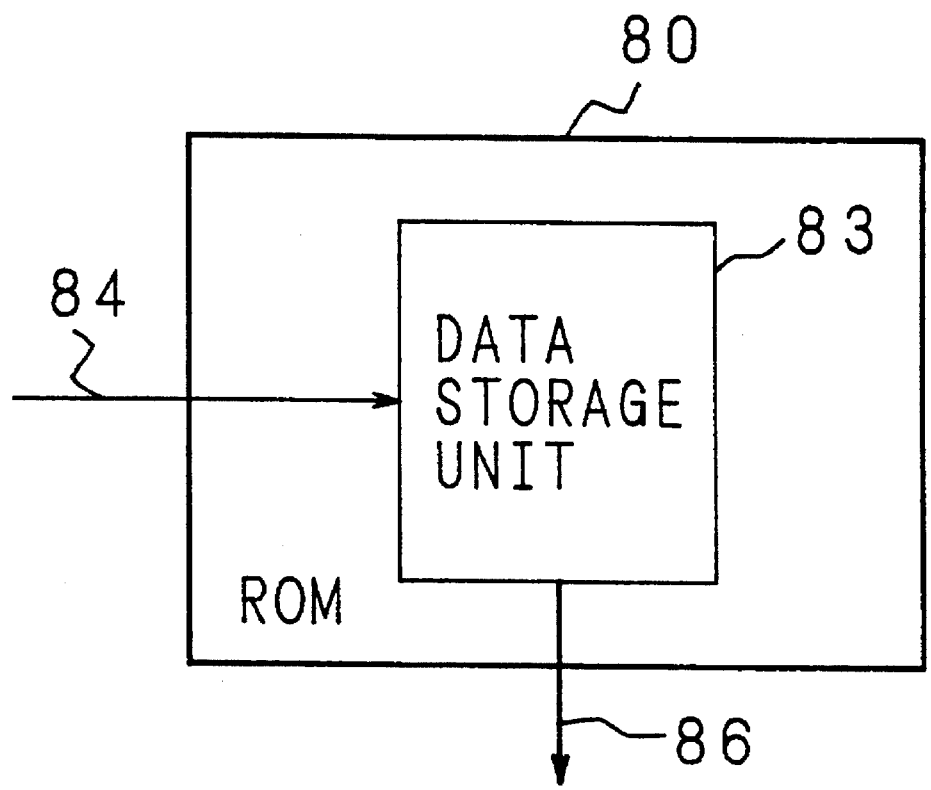
FIG. 1 is a block diagram showing the configuration of a prior art ROM.
Figure 2:
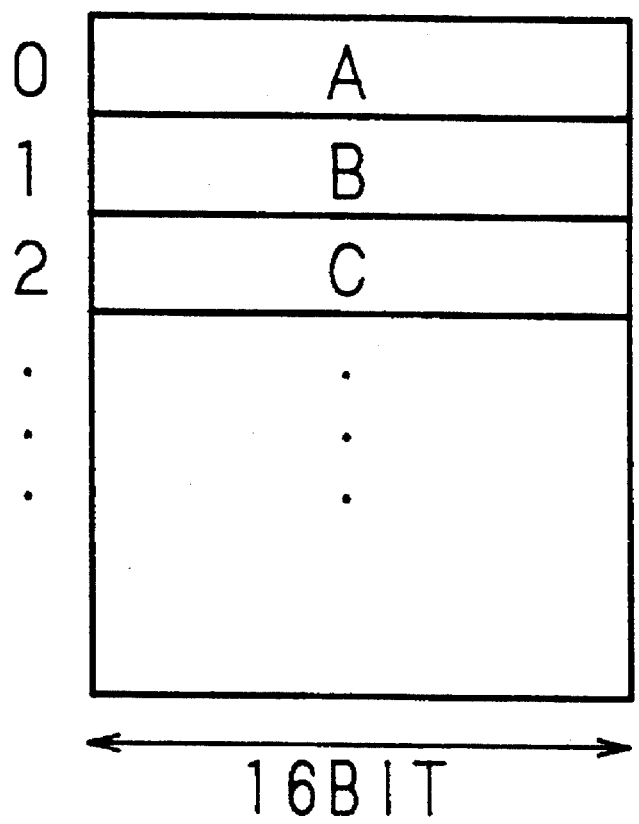
FIG. 2 is a conceptual diagram of data which are stored in the prior art ROM.
Figure 3:
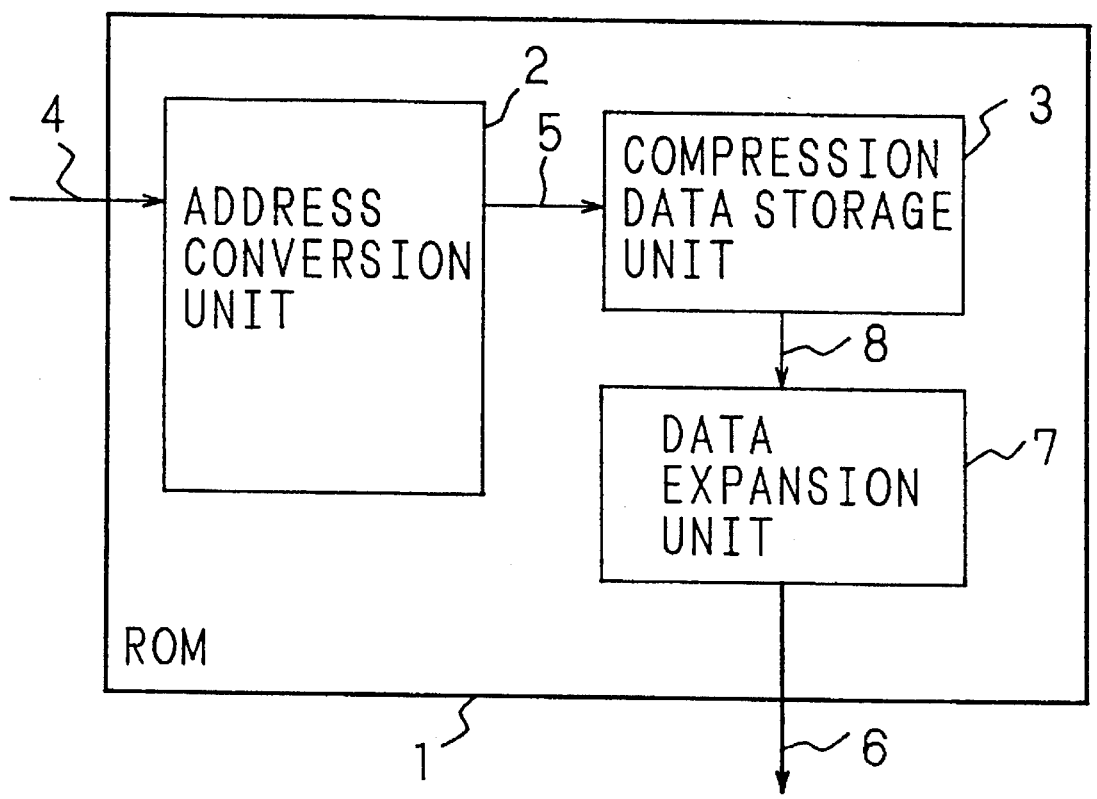
FIG. 3 is a block diagram showing the configuration of a ROM of the first embodiment of the invention.

FIG. 3 is a block diagram showing the configuration of a ROM of to an embodiment of the invention. In the figure, 1 designates the ROM. An address conversion unit 2 converts a read address which is supplied from the outside through an address signal line 4, into a storage address of a corresponding compression data in a compression data storage unit 3. The converted address is given through a signal line 5 to the compression data storage unit 3 which in turn supplies compression data in the storage area designated by the converted address to a data expansion unit 7 through an internal bus 8. The data expansion unit 7 expands the compression data to the original data to be read out, and the expansion data is outputted to the outside of the ROM 1 through a data bus 6.

First, the operation of writing data into the ROM 1 will be described.

Figure 4:
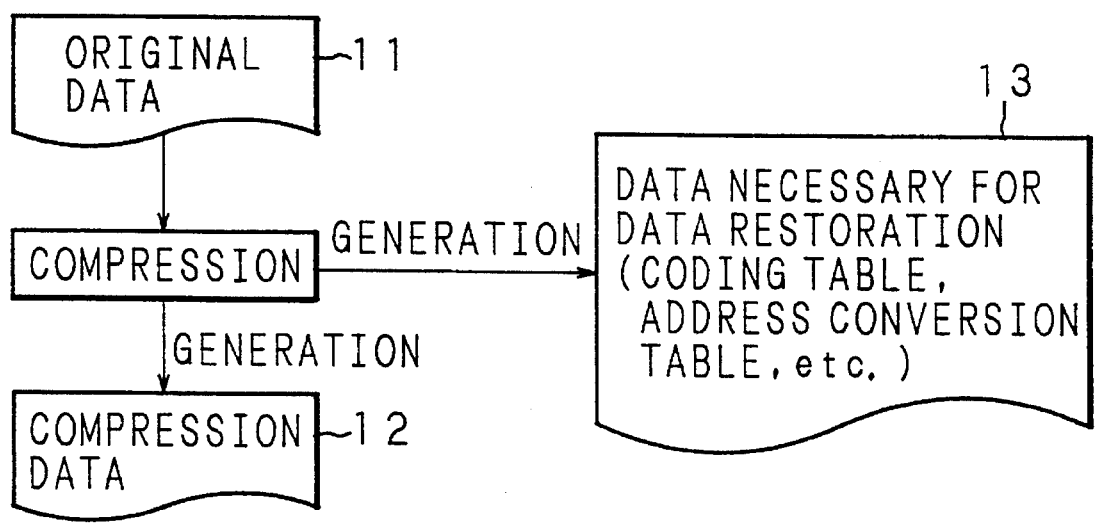
FIG. 4 is a view schematically showing the procedure of writing data into the ROM of the first embodiment.

FIG. 4 is a view schematically showing the procedure of writing data into the ROM 1. Original data 11 are compression-coded by a computer or the like to generate compression data 12. As the data coding system, an optimum one is selected from various systems by such a method as a simulation using a computer (for example, a system which requires the smallest scale of the hardware such as the data expansion unit 7).

Figure 5:
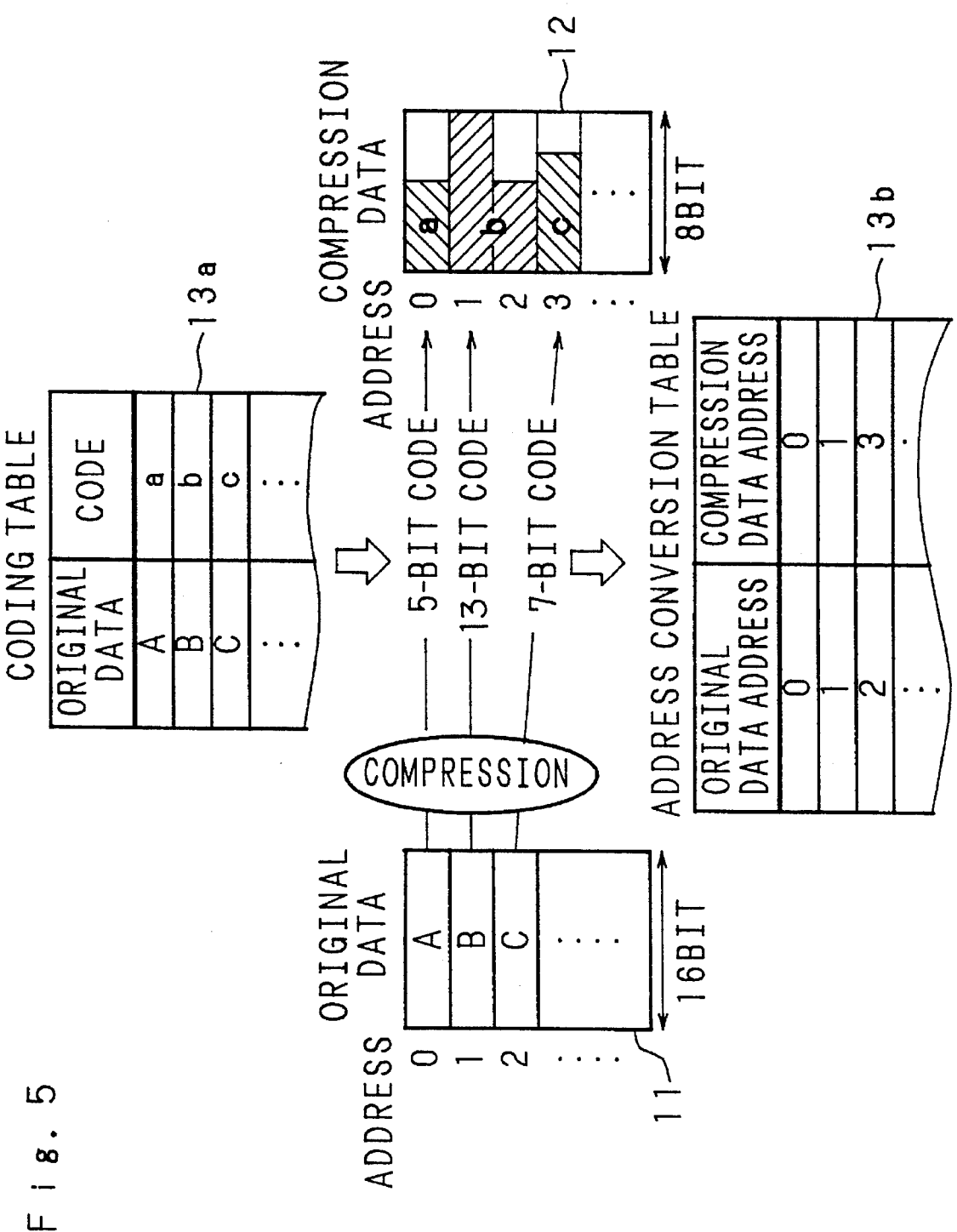
FIG. 5 is a conceptual diagram of an example of a data compression system.

FIG. 5 is a conceptual diagram of a data compression system using a coding table. In the figure, 13a designates a coding table showing the correspondence relations between the original data 11 and codes which are allocated to the original data 11, and 13b designates an address conversion table showing the correspondence relations between addresses of the original data 11 and storage addresses (initial addresses) of the compression data 12 which have been obtained by coding the original data 11. In this coding system, codes are allocated to the original data 11 in accordance with the coding table 13a, thereby coding the original data 11 For example, 16-bit original data 'A', 'B', and 'C' are allocated 5-bit code 'a', 13-bit code 'b', and 7-bit code 'c', respectively In a coding system using a coding table, the contents of compression data are changed in accordance with the contents of the coding table. In the embodiment, therefore, a simulation or the like using a computer is conducted to find adequate contents of the coding table, whereby compression data of the optimum state in which, for example, the amount of data can be minimized are obtained.

The compression data 'a', 'b', and 'c' of the original data 'A', 'B', and 'C' stored at addresses '0', '0', and '2' are allocated initial addresses '0', '1' and '3', respectively. When the coded compression data are to be expanded, the address correspondence between the original data 11 and the compression data 12 is required. Therefore, such a correspondence of address is generated as the address conversion table 13b. The coding table 13a is incorporated in the data expansion unit 7, and the address conversion table 13b in the address conversion unit 2. The data 13 (the coding table 13a, the address conversion table 13b, etc.) necessary for data restoration are extracted during the process of coding the original data 11, from the computer which conducts the coding process.

Finally, the compression data 12 which have been coded are written into the compression data storage unit 3 of the ROM 1, thereby completing the process of writing data into the ROM 1.

Next, the operation of reading out a data from the ROM 1 will be described.

A read address is given through the address signal line 4 to the address conversion unit 2. The read address given to the address conversion unit 2 is equal to the address allocated to the original data 11 shown in FIG. 5. The address conversion unit 2 converts the given read address into the address of the compression data in accordance with the address conversion table 13b, and gives the converted address through the signal line 5 to the compression data storage unit 3. The compression data storage unit 3 reads out a compression data which is stored at the address designated by the converted address, and outputs it to the data expansion unit 7. The data expansion unit 7 expands the compression data which has been given from the compression data storage unit 3, to the original data in accordance with the coding table 13a, and outputs the original data through the data bus 6.

When read address '2' is given in order to read out data 'C' of the original data 11, for example, the address conversion unit 2 converts original data address '2' into compression data address '3' in accordance with the address conversion table 13b, and gives the converted address to the compression data storage unit 3. The compression data storage unit 3 reads out data 'c' which is stored at compression data address '3', and gives it to the data expansion unit 7. The data expansion unit 7 expands compression data 'c' which has been given from the compression data storage unit 3, to data 'C' in accordance with the coding table 13a, and outputs data 'C' through the data bus 6. In this way, original data 'C' corresponding to read address '2' which has been given to the ROM 1 is read out.

In the first embodiment described above, the coding system uses a coding table. Alternatively, a compression coding system which does not use a coding table may be used. Also in such an alternative, the same effects as those of the embodiment can be attained. In the embodiment, the coding of original data is conducted by a computer. In the invention the means for conducting the coding is not restricted to a computer.

According to the first embodiment, optimum contents of the coding table are detected to obtain optimum compression data. Alternatively optimum compression data may be obtained by controlling another factor which affects compression data.

In the first embodiment, every 16 bits of original data are allocated one code. The unit bit number for allocating a code is not restricted to this. Further, although every 8 bits of compression data are designated by one address, the unit bit number for addressing is not restricted to this.

In the first embodiment described above, the coding table 13a is written into the data expansion unit 7. Alternatively, the coding table may be written into an area other than the data expansion unit 7.

[Second embodiment]

Figure 6:
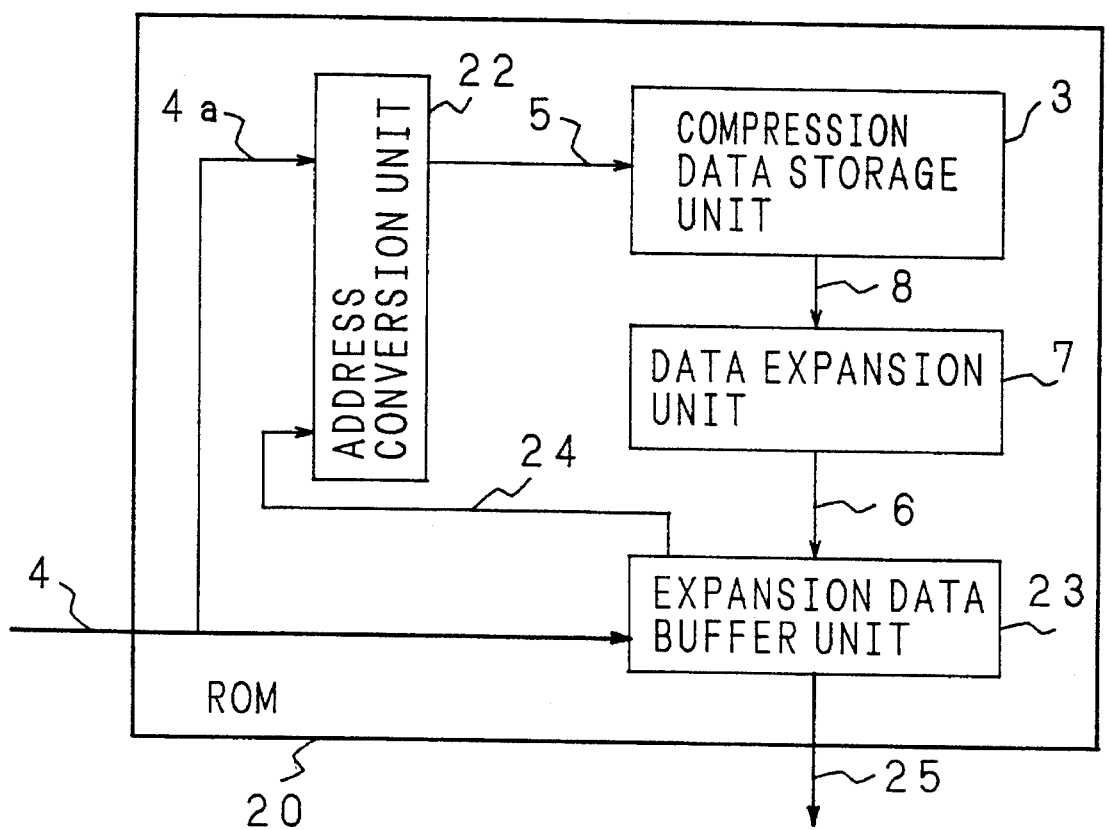
FIG. 6 is a block diagram showing the configuration of a ROM of the second embodiment of the invention.

FIG. 6 is a block diagram showing the configuration of the ROM of another embodiment of the invention. Portions which are identical with or correspond to those of the first embodiment are designated by the same reference numerals, and their description is omitted.

In the figure, 20 designates a ROM, 22 designates an address conversion unit, and 4a designates an address signal line. A read address which is given from the address signal line 4 consists of a block address (upper 3 bits) and a data address (lower 2 bits). A block address in such a read address is given through the address signal line 4a to the address conversion unit 22. Further, the ROM 20 comprises an expansion data buffer unit 23 which temporarily stores data expanded by tile data expansion unit 7, a signal line 24 through which a block identification signal (described later) is given to the address conversion unit 22, and a data bus 25 through which expansion data read out from the expansion data buffer unit 23 are outputted.

The second embodiment is different from the above-described first embodiment in the following points. Data which has once been read out from the compression data storage unit 3 and expanded is temporarily stored in the expansion data buffer unit 23. In the data reading process, it is first judged whether or not the data to be read out exists in the expansion data buffer unit 23. When the expansion data exists in the expansion data buffer unit 23, the expansion process is not conducted, and the expansion data in the expansion data buffer unit 23 is outputted to the outside of the ROM 20.

The procedure of writing data into the ROM 20 in the second embodiment will be described. When data are to be written into the ROM 20, the original data are allocated codes and coded, and then written into the compression data storage unit 3 in the same manner as the writing of data into the ROM 1 in the first embodiment. Unlike the first embodiment, in this writing, the coding is conducted for each block data consisting of four 16-bit data of the original data which are stored at addresses having the same upper 3 bits, thereby generating compression data.

Figure 7:
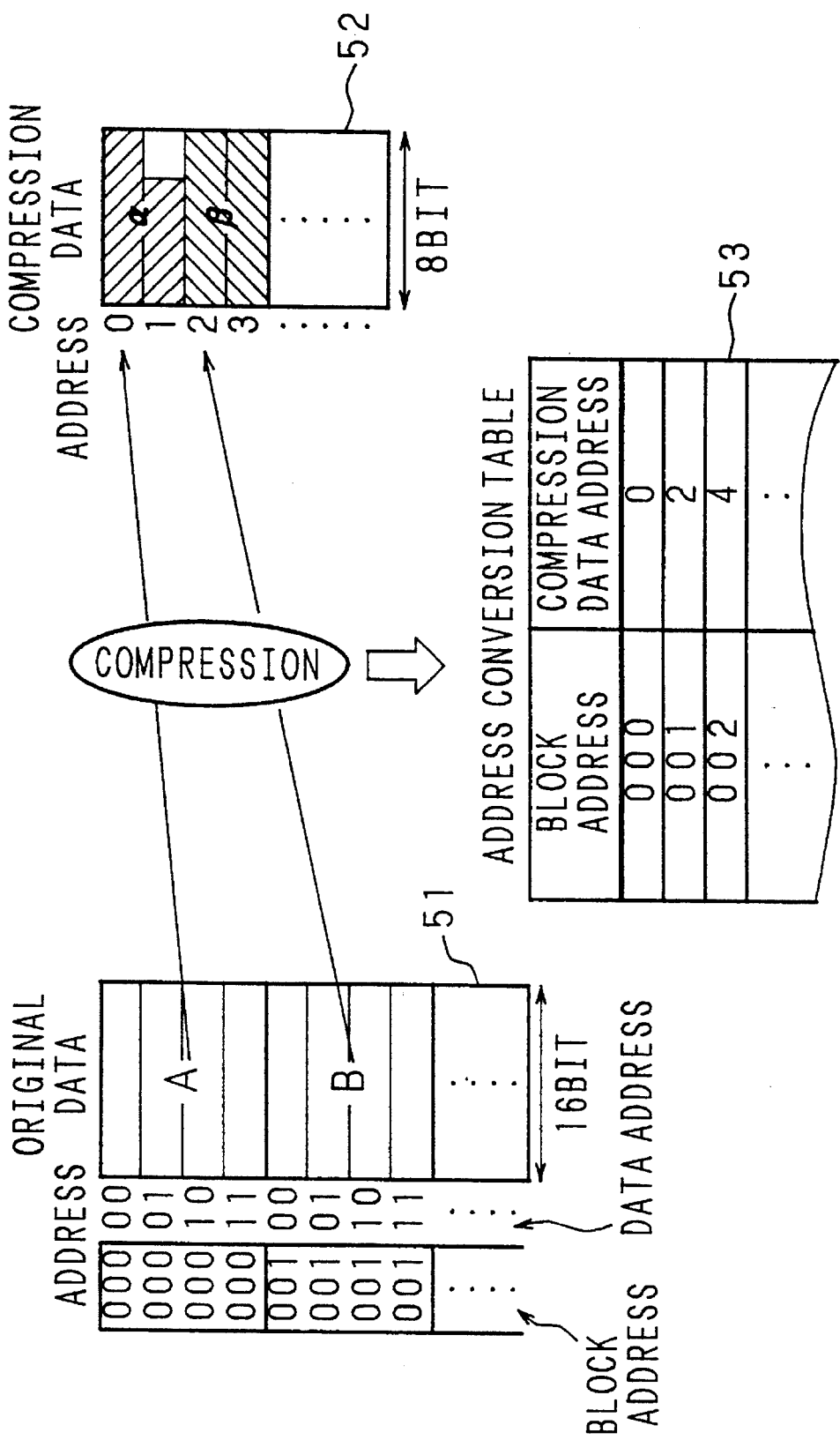
FIG. 7 is a conceptual diagram of another example of a data compression system.

The procedure of coding data in the ROM 20 of the second embodiment will be described specifically with reference to the conceptual diagram of FIG. 7. In the figure, 51 designates original data which have not yet been coded, 52 designates coded compression data, and 53 designates an address conversion table showing the correspondence relations between the block addresses of the original data 51 and the addresses of the compression data.

Four 16-bit data of the original data 51 which are stored at addresses '000 00' to '000 11' are coded as one block data 'A' to generate compression data 'α'. Similarly, four 16-bit data of the original data 51 which are stored at addresses '001 00' to '001 11' are coded as one block data 'B' to generate compression data 'β'. The compression data 'α' and 'β' are allocated addresses '0' and '2', respectively A block address which consists of the upper 3 bits of respective 16-bit data constituting a block data of the original data 51 is commonly used for each block data. For example, '000' is used commonly for block data 'A', and '001' is used commonly for the block data 'B'. Therefore, each of the block addresses of original data 51 can be used as the identification of a block. Each of data constituting a block data can be identified by a data address which consists of the lower 2 bits of the address of the original data 51. Accordingly, each of the data addresses is used as the identification of data. In the coding process, the address conversion table 53 showing the correspondence relations between the block addresses and the addresses allocated to the compression data is generated.

Figure 8:
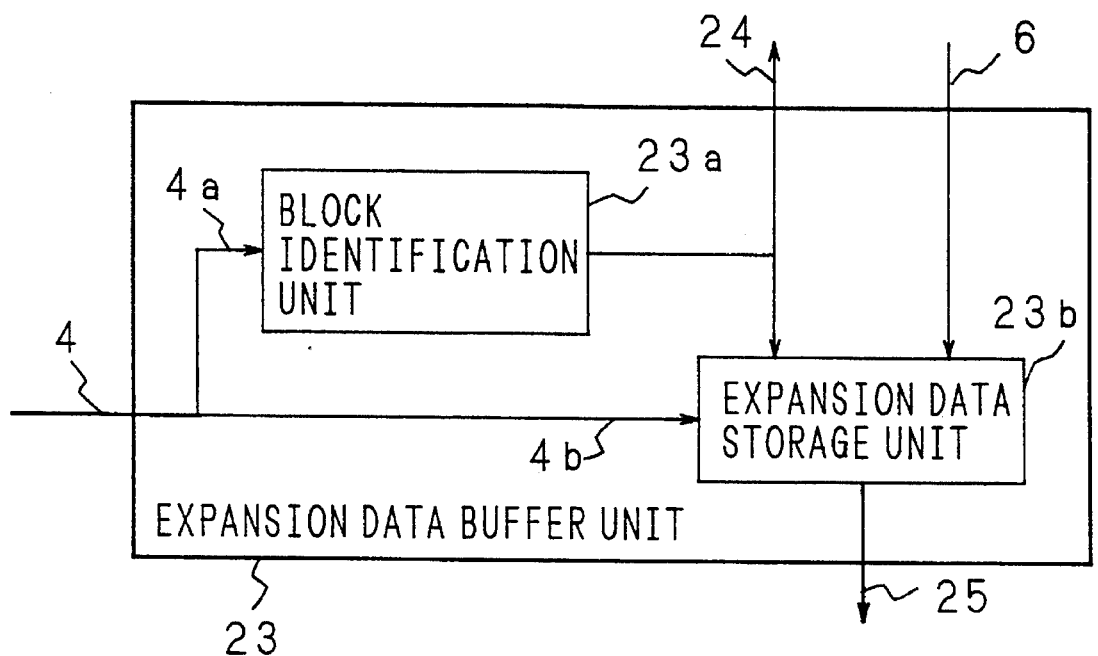
FIG. 8 is a block diagram showing the internal configuration of the expansion data buffer unit of FIG. 6.

FIG. 8 is a block diagram showing the internal configuration of the expansion data buffer unit 23 shown in FIG. 6. In the figure, 23a designates a block identification unit, 23b designates an expansion data storage unit for storing block data which have been expanded once by the data expansion unit 7, 4a designates a signal line through which a block address is given to the block identification unit 23a, and 4b designates a signal line through which a data address is given to the expansion data storage unit 23b. The block identification unit 23a judges whether or not the expansion data storage unit 23b stores expansion data of a block including data which is to be read out, on the basis of a block address in a read address.

Figure 9:
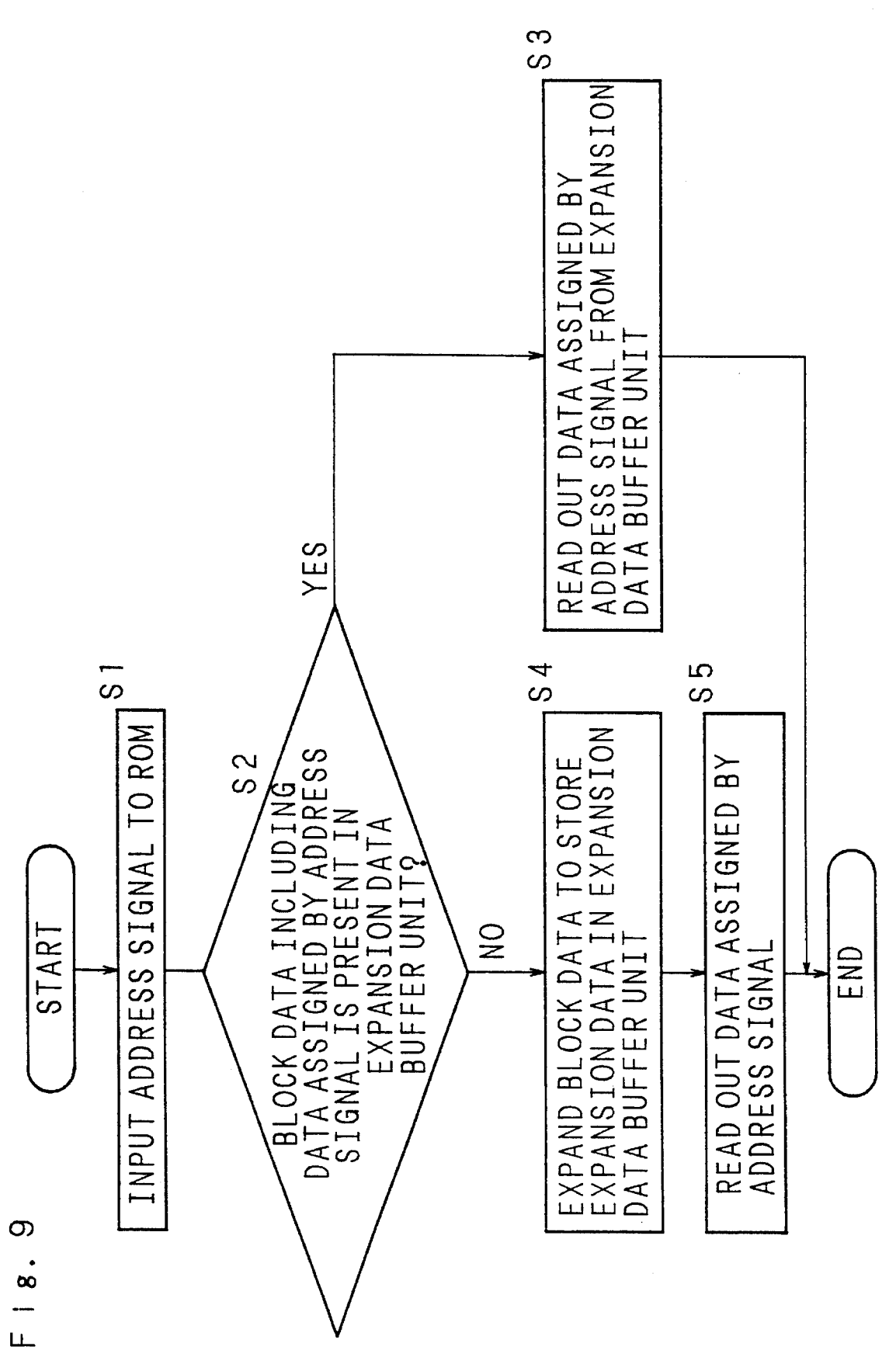
FIG. 9 is a flowchart showing the procedure of reading out data from the ROM of the second embodiment.

The procedure of reading out a data from the ROM 20 of the second embodiment will be described with reference to the flowchart of FIG. 9.

When an address signal is supplied to the expansion data buffer unit 23 of the ROM 20 (S1), the block address in the address signal is given to the block identification unit 23a. The block identification unit 23a checks to judge whether or not the block data which is designated by the block address and includes the data designated by the address signal is stored in the expansion data storage unit 23b of the expansion data buffer unit 23 (S2). If a block data conforming to the conditions is stored in the expansion data storage unit 23b, the data designated by the address signal is read out from the block data in the expansion data storage unit 23b, thereby completing the reading process (S3).

If no block data conforming to the conditions is stored in the expansion data storage unit 23b, the compression data storage unit 3 is accessed. The block data including the data designated by the address signal is expanded to be newly stored in the expansion data buffer unit 23 (the expansion data storage unit 23b) (S4), and the data designated by the address signal is outputted to the outside of the ROM 20, thereby completing the reading process (S5).

The operations (steps S4 and S5) which are conducted in the case where no block data conforming to the conditions is stored in the expansion data storage unit 23b of the expansion data buffer unit 23 will be described.

The address of the original data 51 is given to the ROM 20 through the address signal line 4. The block address in the address is given through the address signal line 4a to the address conversion unit 22. In accordance with the address conversion table 53 which was generated in the process of coding the original data, the address conversion unit 22 converts the block address into a compression data address, and supplies a conversion address signal to the compression data storage unit 3. The compression data storage unit 3 reads out the compression data which is stored at the compression data address designated by the conversion address signal, and outputs the compression data to the data expansion unit 7. In the same manner as the first embodiment, the data expansion unit 7 expands the coded compression data and outputs the expansion data to the expansion data buffer unit 23.

When the given address of the block data is '000 01', for example, the address conversion unit 22 is supplied with block address '000'. The address conversion unit 22 converts the block address '000' into compression data address '0' in accordance with the address conversion table 53, and gives the compression data address to the compression data storage unit 3. The compression data storage unit 3 reads out data 'α' stored at the address '0', and supplies it to the data expansion unit 7. The data expansion unit 7 expands compression the data 'α' to block data 'A' which is the data before the coding, and outputs the expansion data to the expansion block data buffer unit 23.

The expansion block data is stored in the expansion data storage unit 23*b* of the expansion data buffer unit 23. Simultaneously with the storage of the block data into the expansion data storage unit 23*b*, the block address of the block data is written into a block address storage unit (not shown) of the block identification unit 23*a*, and the 16-bit data of the block data which is designated by the data address is selected by unillustrated means. The selected data is outputted from the ROM 20 through the data bus 25.

Figure 10:
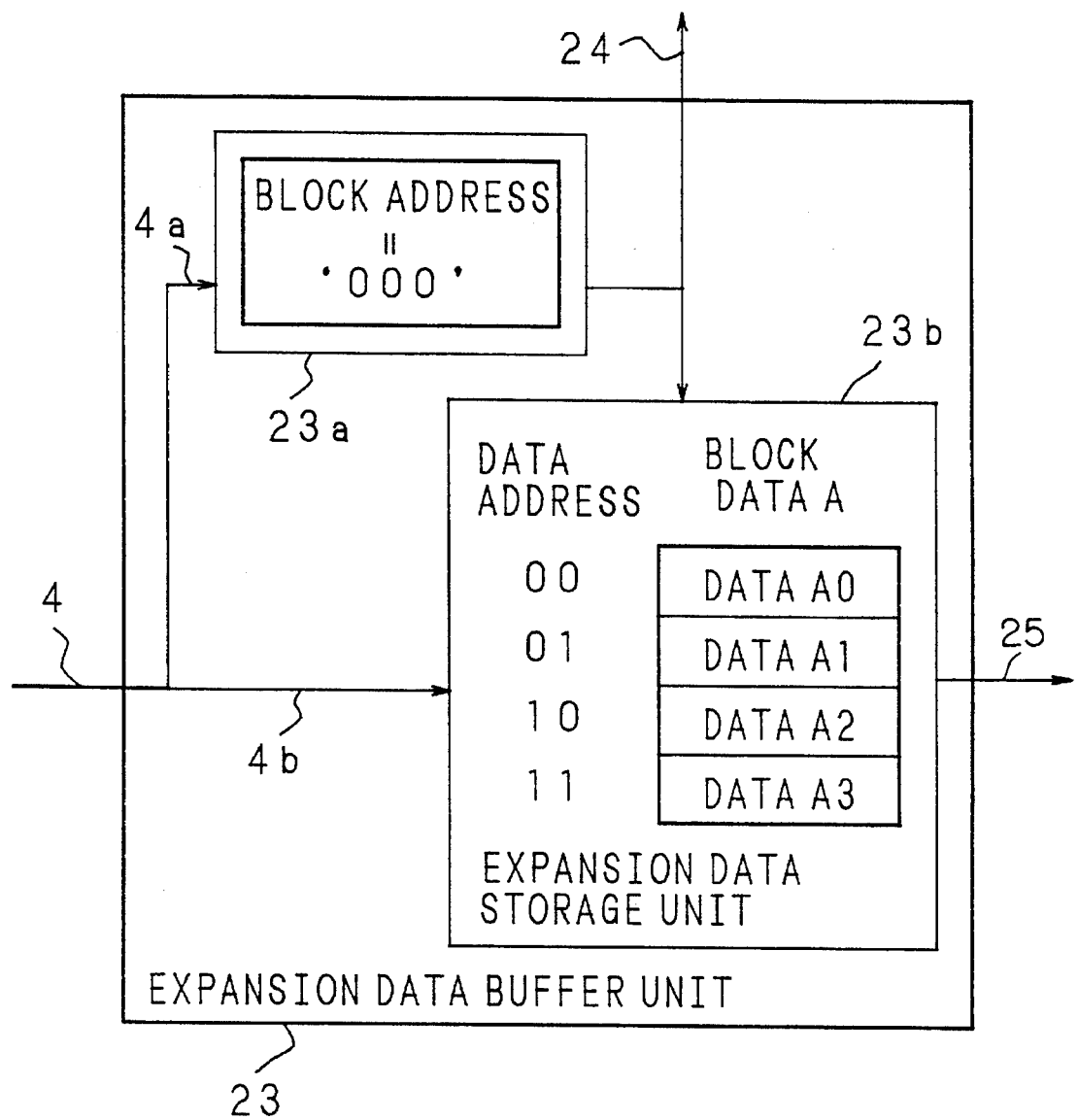
FIG. 10 is a conceptual diagram of a data storing state in the expansion data buffer unit shown in FIG. 8.

FIG. 10 is a conceptual diagram showing the state in which block data 'A' expanded in the data expansion unit 7 is stored in the expansion data storage unit 23*b* of the expansion data buffer unit 23 and block address '000' of block data 'A' is written into the block address storage unit of the block identification unit 23*a*. In FIG. 10, at the same time when the block data 'A' is stored in the expansion data storage unit 23*b*, 16-bit data 'A1' of the block data 'A' which is designated by data address '01' is selected and outputted from the ROM 20.

Next, the operation (step S2) of judging whether or not the block data which includes the data designated by the address signal is stored in the expansion data storage unit 23*b* of the expansion data buffer unit 23 will be described.

When an address of the original data 51 is given to the ROM 20 through the address signal line 4, the address is given to the expansion data buffer unit 23, and the block address in the address is given to the block identification unit 23*a* through the address signal line 4*a*. As described above, the block addresses of the block data stored in the expansion data storage unit 23*b* are held in the block identification unit 23*a*. Therefore, the block identification unit 23*a* compares the block address supplied through the address signal line 4*a* with the block address held by the unit itself. If the comparison shows that the both addresses coincide with each other, the block identification unit 23*a* judges that the block data conforming to the conditions is stored in the expansion data storage unit 23*b*. If the comparison shows that the both addresses do not coincide with each other, the block identification unit 23*a* judges that no block data conforming to the conditions is stored in the expansion data storage unit 23*b*. Then, the block identification unit 23*a* sends a block identification signal indicative of the judging result, to the expansion data storage unit 23*b* and the address conversion unit 22 through the signal line 24.

Further, the operation (step S3) which is conducted in the case where the block data conforming to the conditions is stored in the expansion data buffer unit 23 will be described.

It is assumed that, in the expansion data buffer unit 23, expanded block data 'A' is stored as shown in FIG. 10. When address '000 01' of the original data 51 is given to the ROM 20, for example, the block identification unit 23*a* judges that block data 'A' including the data at the address is stored in the expansion data storage unit 23*b*, and sends a block identification signal to the expansion data storage unit 23*b* and the address conversion unit 22 through the signal line 24. The address conversion unit 22 to which the block identification signal is sent from the block identification unit 23*a* is inhibited from newly conducting the expansion of compression data, by unillustrated means. On the other hand, data address '10' of the address is given to the expansion data storage unit 23*b*, and data 'A2' of stored block data 'A' which is designated by data address '10' is read out from the expansion data storage unit 23*b*.

In the second embodiment, four 16-bit data constitute one block data. In the invention, the number of data constituting a block data is not restricted to four, and the number of bits of one data is not restricted to 16 bits. Although, in the embodiment, a block address for identifying block data is 3 bits in length and a data address for identifying data of block data is 2 bits in length, the bit numbers of 1 the addresses are not restricted to these numbers.

In the first and second embodiments, an address conversion table showing all the correspondence relations between the address of the original data or the block addresses and the addresses allocated to the compression data is used. Depending on the relation between the addresses, the address conversion table is not required to show all the correspondence relations. When the address conversion can be conducted without using an address conversion table, it is not necessary to use an address conversion table.

[Third embodiment]

Figure 11:
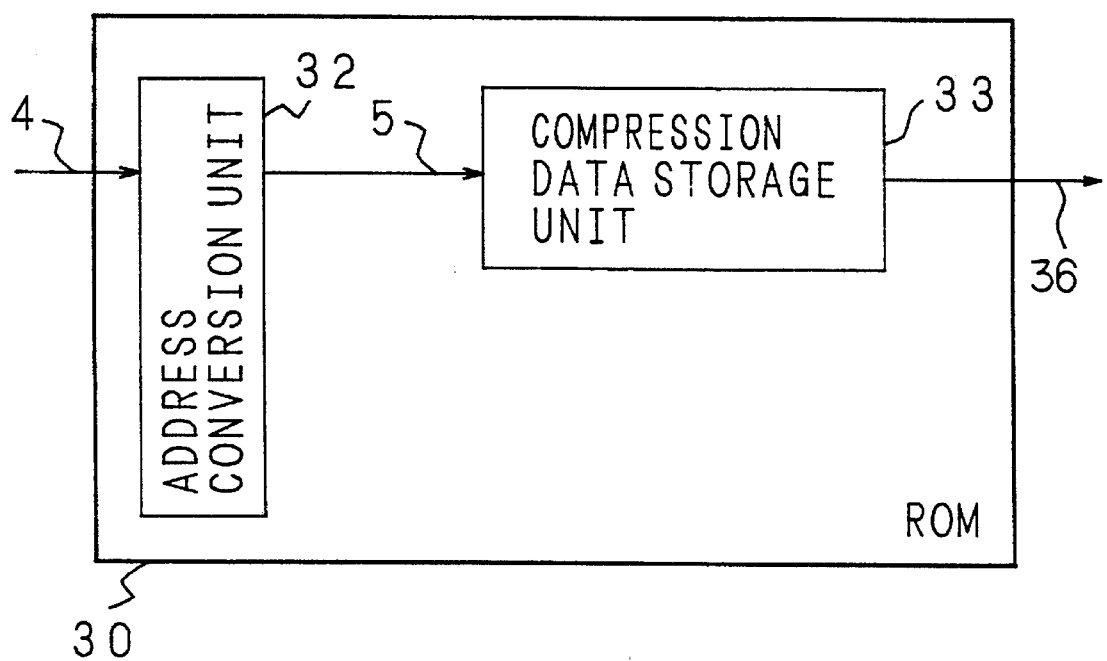
FIG. 11 is a block diagram showing the configuration of a ROM of the third embodiment of the invention.

FIG. 11 is a block diagram showing the configuration of a ROM of a further embodiment of the invention. Portions which are identical with or correspond to those of the embodiments described above are designated by the same reference numerals, and their description is omitted. In the figure, 30 designates a ROM, 32 designates an address conversion unit, and 33 designates a compression data storage unit. The third embodiment is different from the embodiments described above in that a method is employed in which data compression is conducted by deleting identical data which repeatedly occur in the original data, except one data.

The operation of writing data into the ROM 30 of the third embodiment will be described.

Figure 12:
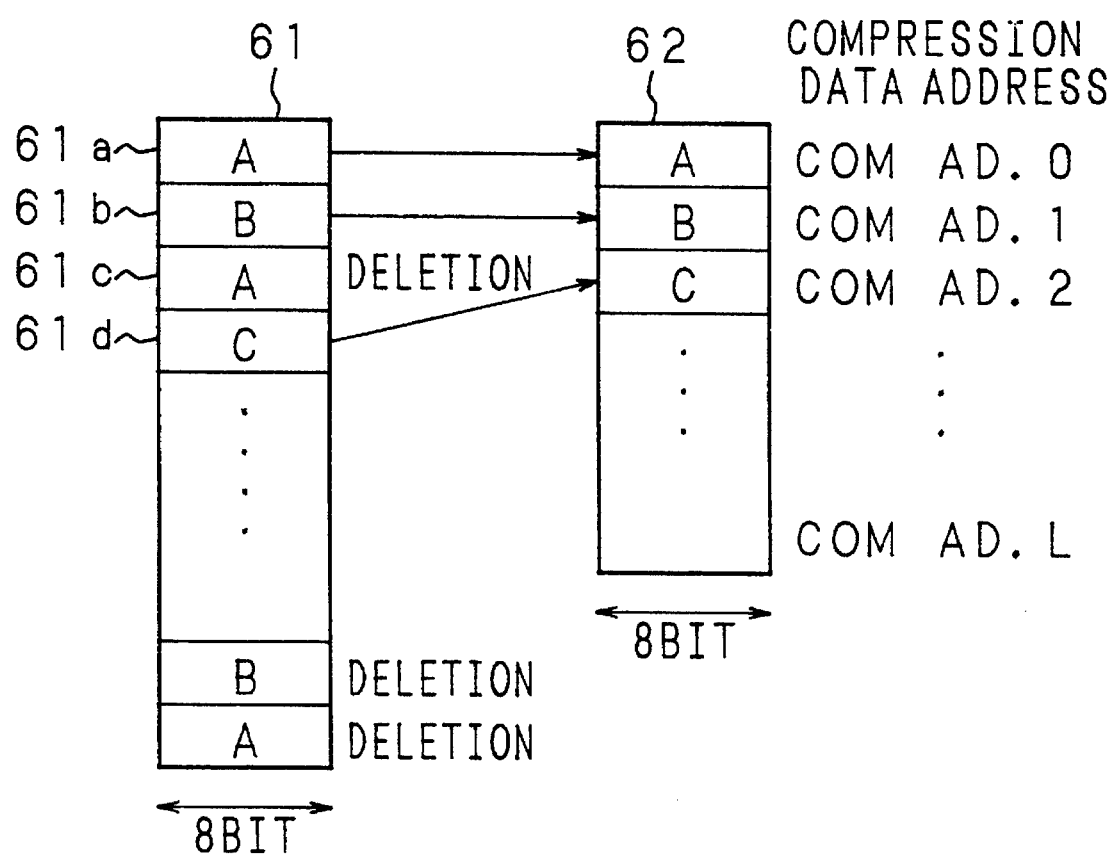
FIG. 12 is a conceptual diagram of a further example of the data compression system.

First, the method of compressing the original data to be written will be described with reference to FIG. 12. In the figure, 61 designates original data which have not yet been compressed, and 62 designates compression data. In the third embodiment, the original data 61 are divided into 8-bit data 61*a*, 61*b*, 61*c*, 61*d*, . . . , and all data of duplicate 8-bit data are deleted while leaving one data undeleted. In FIG. 12, for example, 8-bit data 'A' are duplicated in the original data 61, and therefore all data 'A' are deleted except one data 'A'. Also for other data, duplicate data are deleted in the same manner, whereby the compression data 62 is generated from the original data 61. Every 8 bits of the compression data 62 are allocated compression data addresses 'COM AD.0, COM AD.1, COM AD.2, . . . , COM AD.L'.

Figure 13:
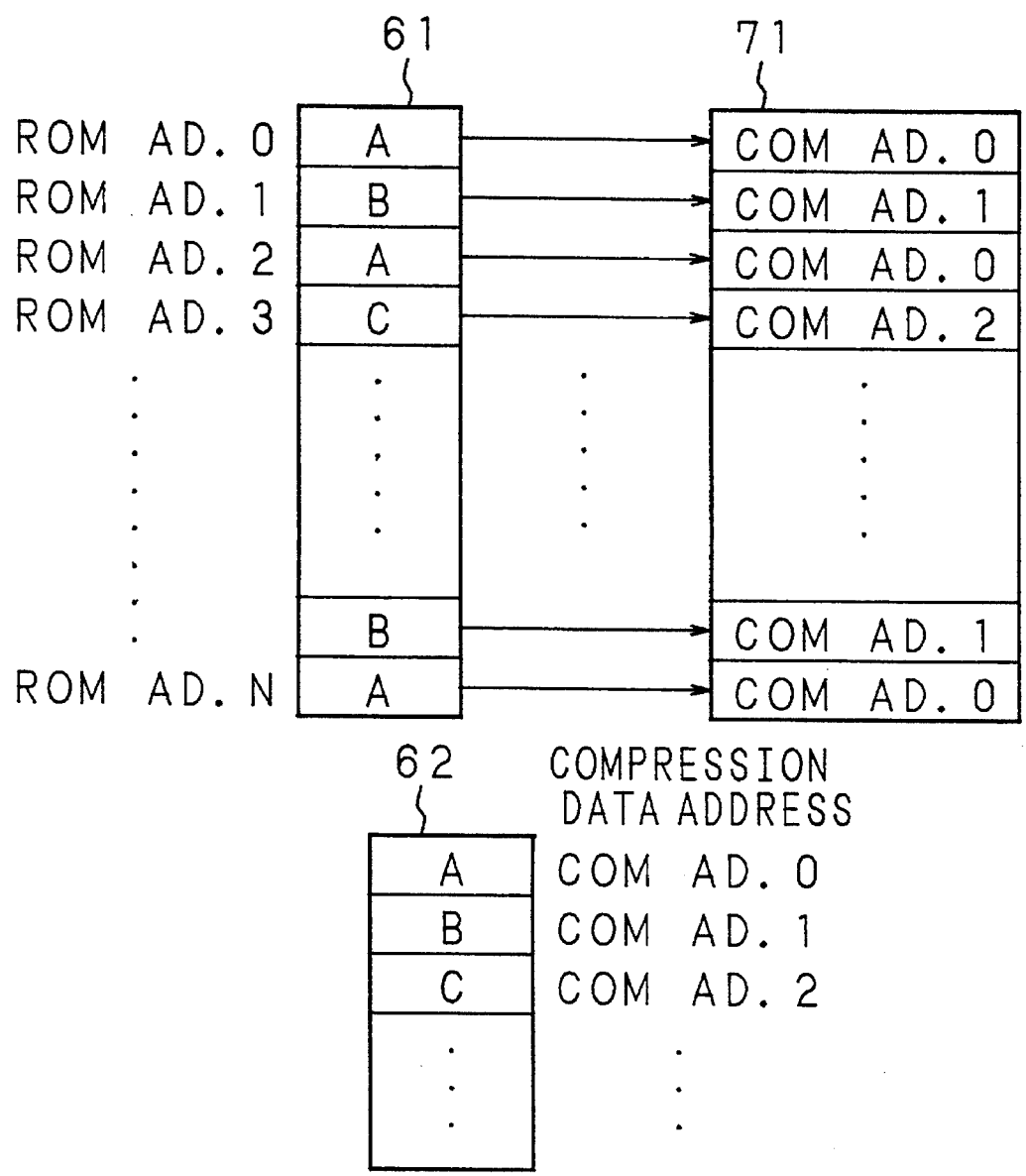
FIG. 13 is a conceptual diagram of address conversion data used in the data compression system of FIG. 12.

Simultaneously with the generation of the compression data 62, address conversion data required for data-restoration are generated. FIG. 13 is a conceptual diagram of the address conversion data. First, 8-bit data of the original data 61 are converted into compression data addresses which are allocated to the compression data 62 respectively corresponding to the 8-bit data, to generate address conversion data 71. For example, data 'A' (61*a*, 61*c*, . . . ) of the original data 61 are converted into compression data address <COM AD.0> allocated to data 'A' of the compression data 62. In other words, the address conversion data 71 are represented by the compression data addresses <COM AD.0, COM AD.1, AD.0, ROM AD.1, . . . > of the original data. The compression data 62 generated in this way are written into the compression data storage unit 33, and the address conversion data 71 into the address conversion unit 32, thereby completing the operation of writing data into the ROM 30.

Next, the operation of reading out a data from the ROM 30 will be described.

A read address of the original data 61 is supplied to the address conversion unit 32 through the address signal line 4. The supplied read address is given as it is to the address conversion unit 32. On the basis of the address conversion data 71, the address conversion unit 32 outputs the compression data address designated by the supplied address, to the compression data storage unit 33, with the result that the read address of the original data 61 is converted into the compression data address. The compression data storage unit 33 to which the conversion address is supplied through the signal line 5 outputs the data at the compression data address, to the outside of the ROM 30 through the data bus 36, thereby completing the data read process. When address <ROM AD.2> is sent on the address signal line 4, for example, this address <ROM AD.2> is given to the address conversion unit 32. Then, compression data address <COM AD.0> stored at the storage area designated by address <ROM AD.2> is given to the compression data storage unit 33, and data 'A' corresponding to compression data address <COM AD.0> is outputted to the data bus 36.

[Fourth embodiment]

Figure 14:
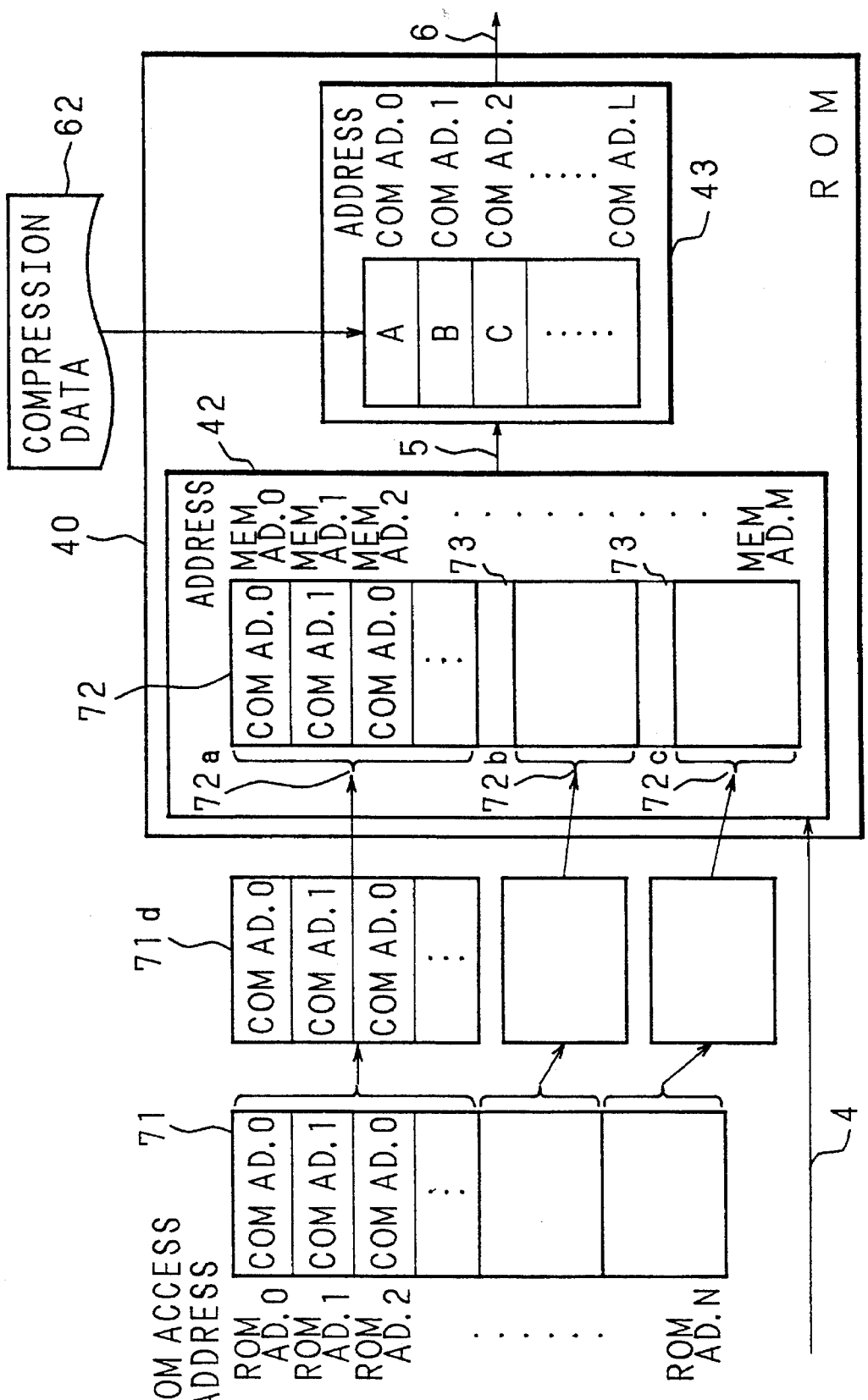
FIG. 14 is a view showing the configuration of a ROM of a fourth embodiment of the invention and the data storing state in the ROM.

FIG. 14 is a view showing the configuration of a ROM according to a still further embodiment of the invention and a data storing state in the ROM. Portions which are identical with or correspond to those of the above-described embodiments are designated by the same reference numerals, and their description is omitted. In the figure, 40 designates a ROM, 42 designates an address conversion unit, and 43 designates a compression data storage unit. The fourth embodiment is different from the embodiments described above in that dummy data which can be subjected to the address conversion are mixed with address conversion data.

The operation of writing data into the ROM 40 of the fourth embodiment will be described.

The compression data 62 which are generated by the same data compression system as that of the third embodiment are written into the compression data storage unit 43. On the other hand, the storage capacity of the address conversion unit, 42 is set so as to be larger than that required for storing the address conversion data 71. The address conversion data 71 which are generated by the same method as that of the third embodiment are divided at appropriate positions into a plurality of groups 71d as shown in FIG. 14. These groups are written into adequate storage areas of the address conversion unit 42 in such a manner that the groups are separated from each other. The manner of allocating the groups obtained by dividing the address conversion data 71 to the storage areas of the address conversion unit 42 can be set at the option of the user of the ROM 40 (namely, the allocation is user-programmable). Further, compression data addresses by which compression data can be read out from the compression data storage unit 43 are written as dummy address conversion data into areas 73 of the address conversion unit 42 where the address conversion data 71 are not written, so that the storage capacity of the address conversion unit 42 is fully used. To address conversion data 72 including the dummy data which are allocated to the address conversion unit 42 in this way, addresses <MEM AD.0, MEM AD.1, . . . , MEM AD.M> are given.

Next, the operation of reading out a data from the ROM 40 of the fourth embodiment, will be described.

Figure 15:
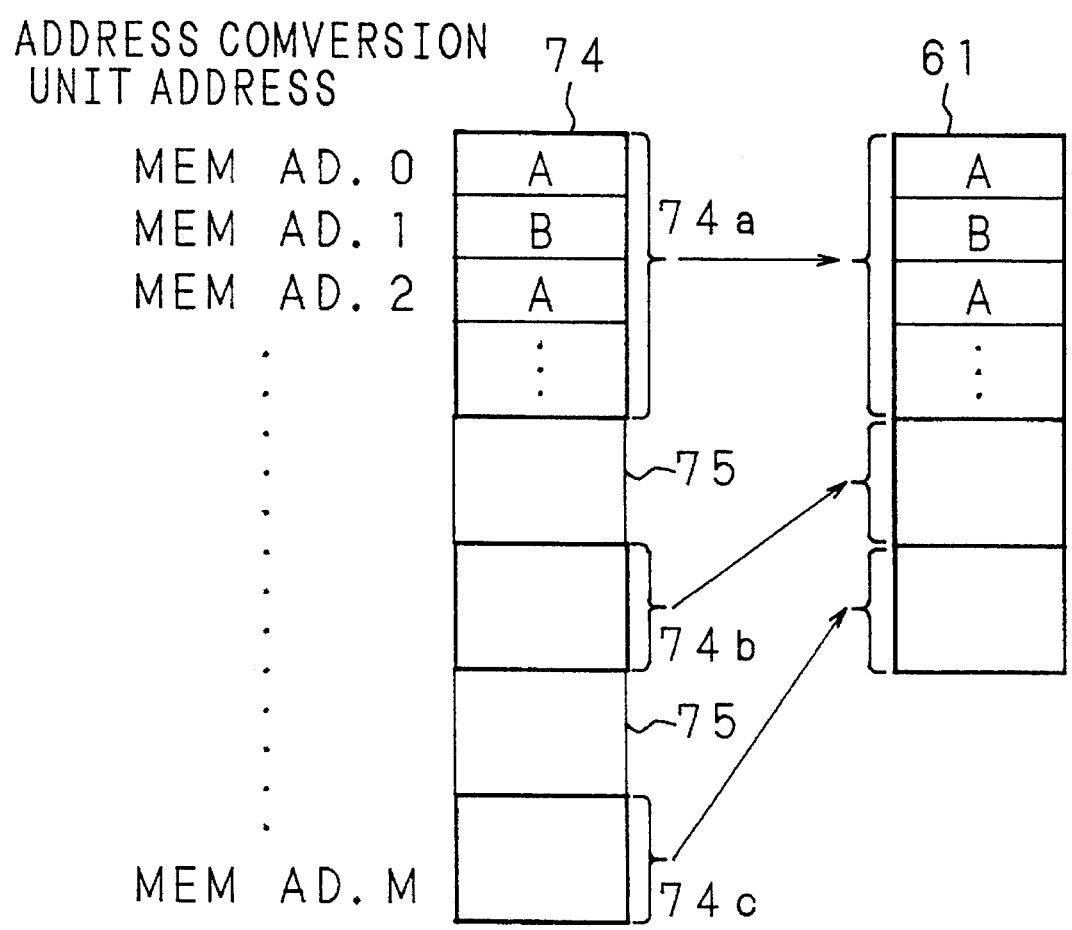
FIG. 15 is a conceptual diagram of data restoration in the ROM of the fourth embodiment.

When the user who knows the areas of the address conversion unit 42 to which the correct address conversion data 71 are allocated gives selectively an address from which a correct data is to be read out to the address signal line 4, only data 74a, 74b and 74c in FIG. 15 are read out to restore the original data 61. By contrast, in the case where a person does not know the areas of the address conversion unit 42 to which the correct address conversion data 71 are allocated, when the person gives sequentially addresses <MEM AD.0> to <MEM AD.M> of the address conversion unit 42 to the unit 43 through the address signal line 5, read out is restoration data 74 which includes the correct data 74a, 74b and 74c and dummy data 75 obtained by the dummy address conversion data as shown in FIG. 15.

If a person does not know the areas of the address conversion unit 42 to which the correct address conversion data 71 are allocated, the person cannot judge which data of the restoration data 74 are correct ones. When a copy operation is to be done, therefore, the whole of the data 74 must be copied, requiring a ROM into which the copied data are stored to have a storage capacity larger than that necessary for storing the correct data. It may be possible for a person other than the user to analyze the ROM to obtain information on the areas of the restoration data 74 where the correct data are written and to copy the correct data. However, such an analysis requires a prolonged time period, resulting in that it is difficult to copy the correct data. In the ROM 40 of the fourth embodiment, the original data are once compressed and then written in. Even when the capacity of the address conversion unit 42 which must be enlarged by the size for storing dummy data is considered, therefore, the storage requirement of the ROM can be set so as to be as large as that of a prior art ROM.

In the third and fourth embodiments described above, the original data 61 are divided in the unit of 8 bits in the generation of the compression data 62 (FIG. 12). Another bit number may be used as the unit of the division of the original data 61. The data compression system for the third and fourth embodiments is not restricted to that described above. Another data compression system may be used with attaining the same effects. When the compression system used in the first embodiment is applied to the third and fourth embodiments, for example, a data expansion unit should be provided in order to expand compression data which has been read out.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

What is claimed is:

1. A read only memory comprising: p1 compression data storage means for storing compression data of original data;

address conversion means for converting a read address of the original data supplied to read out the original data, into a storage address of the compression data which is stored in said compression data storage means and corresponds to the original data; and data restoration means for restoring the original data from the compression data which is stored at the storage address converted by said address conversion means.

2. A read only memory according to claim 1, wherein said compression data storage means stores a compression data which is obtained by a coding system using a coding table.

3. A read only memory according to claim 1, wherein said data restoration means comprises a coding table which shows a correspondence relation between the original data and a code allocated to the original data, and said address conversion means comprises an address conversion table which shows a correspondence relation between the read address of the original data and the storage address of the compression data which is obtained by coding the original data.

4. A read only memory according to claim 1, further comprising:

storage means for storing the original data which is restored from the compression data;

detection means for judging whether or not the original data is stored in said storage means; and means responsive to said detection means for outputting the original data from said storage means to the outside.

5. A read only memory according to claim 4, wherein said detection means is responsive to the read address of the original data.

6. A read only memory comprising:

compression data storage means for storing compression data of original data;

address conversion means for converting a read address of the original data supplied to read out the original data, into a storage address of the compression data which is stored in said compression data storage means and corresponds to the original data;

data restoration means for restoring the original data from the compression data which is stored at the storage address converted by said address conversion means;

original data storage means for storing the restored original data; and detection means for judging whether or not a new original data to be read out is stored in said original data storage means, reading means responsive to said detection means for, reading out the new original data from said original data storage means without accessing said compression data storage means, said address conversion means, and said data restoration means.

7. A read only memory according to claim 6, wherein said compression data storage means stores compression data which is obtained by conducting a coding on each block data which consists of a plurality of original data, addresses of the plurality of original data being identical in upper two or more bits.

8. A read only memory according to claim 7, wherein the read address of an original data consists of a block address identifying a block to which the original data belongs, and a data address identifying the original data itself, and said detection means conducts the judging operation on the basis of the block address.

9. A read only memory comprising:

compression data storage means for storing original data compression into compression data; and address conversion means for converting a read address of the original data supplied from the outside in order to read out the original data from said memory, into a storage address of the compression data.

10. A read only memory according to claim 9, wherein said compression data storage means stores a compression data which is obtained by deleting identical data which repeatedly occur in the original data, except one of the identical data.

11. A read only memory comprising:

compression data storage means for storing original data compressed into compression data; and address conversion means for storing address conversion data including dummy address conversion data representing position of the compression data in said storage means, and read address conversion data in which a read address of the original data is correlated with a storage address of the original data in said compression data storage means, said address conversion means converting a read address supplied to read out the original data from said memory, into a storage address of the compression data, using the stored address conversion data.

12. A read only memory according to claim 11, wherein said compression data storage means stores compression data which is obtained by deleting identical data which repeatedly occur in the original data, except one of the identical data.

13. A read only memory according to claim 11, wherein said compression data storage means stores a compression data which is obtained by a compression coding system, and said memory further comprises data restoration means for restoring the compression data read out from said compression data storage means to the original data.

* * * * *